(12) United States Patent
Harwit et al.

(10) Patent No.: US 7,796,174 B1
(45) Date of Patent: Sep. 14, 2010

(54) HYBRID IMAGER

(75) Inventors: Alex Harwit, Boulder, CO (US); David A. Dorn, Loveland, CO (US); Christopher Lynn Mears, Boulder, CO (US); Morley M. Blouke, Erie, CO (US); Robert H. Philbrick, Erie, CO (US); Theresa J. Axenson, Longmont, CO (US)

(73) Assignee: Ball Aerospace & Technologies Corp., Boulder, CO (US)

( * ) Notice: Subject to any disclaimer, the term of this patent is extended or adjusted under 35 U.S.C. 154(b) by 600 days.

(21) Appl. No.: 11/695,390

(22) Filed: Apr. 2, 2007

Related U.S. Application Data

(60) Provisional application No. 60/745,607, filed on Apr. 25, 2006.

(51) Int. Cl.
*H04N 3/14* (2006.01)
*H04N 5/335* (2006.01)

(52) U.S. Cl. .................. 348/311; 348/295; 348/300; 250/208.1

(58) Field of Classification Search .................. None
See application file for complete search history.

(56) References Cited

U.S. PATENT DOCUMENTS

| | | | |
|---|---|---|---|
| 5,250,824 A * | 10/1993 | Janesick | ..................... 257/216 |
| 5,449,908 A | 9/1995 | Wadsworth et al. | |
| 5,543,641 A | 8/1996 | Wadsworth et al. | |
| 5,559,553 A | 9/1996 | Bitek | |
| 5,652,150 A * | 7/1997 | Wadsworth et al. | ............ 438/60 |
| 5,828,406 A | 10/1998 | Parulski et al. | |
| 5,874,993 A | 2/1999 | Ciccarelli et al. | |
| 5,904,495 A | 5/1999 | Burke et al. | |
| 6,121,843 A | 9/2000 | Vampola et al. | |
| 6,292,218 B1 | 9/2001 | Parulski et al. | |
| 6,303,923 B1 | 10/2001 | Wadsworth et al. | |
| 6,403,964 B1 * | 6/2002 | Kyyhkynen | ............ 250/370.09 |
| 6,576,899 B2 | 6/2003 | Sinha et al. | |
| 6,590,197 B2 | 7/2003 | Wadsworth et al. | |
| 6,703,617 B1 * | 3/2004 | Spartiotis et al. | ....... 250/370.09 |
| 7,115,925 B2 | 10/2006 | Rhodes | |
| 2002/0020801 A1 * | 2/2002 | Wadsworth et al. | ...... 250/208.1 |

(Continued)

OTHER PUBLICATIONS

Janesick, "Charge Coupled CMOS and Hybrid Detector Arrays," Keynote Address, Focal Plane Arrays for Space Telescopes, Proc. Of SPIE, 2004, vol. 5167, pp. 1-18.*

(Continued)

*Primary Examiner*—Jason Whipkey
*Assistant Examiner*—Dennis Hogue
(74) *Attorney, Agent, or Firm*—Sheridan Ross P.C.

(57) ABSTRACT

The present invention relates to imaging systems that generally include at least a first substrate, on which a charge coupled device imaging sensor array is formed, and a second substrate on which readout circuitry is formed. Information related to the amount of light incident on pixels included in the imaging sensor array is passed to the readout circuitry as a voltage signal over an interconnection between the imaging sensor array and the readout circuitry. Accordingly, the readout circuitry may sample the output of the imaging sensor array multiple times. The system allows different processes to be used for forming the imaging sensor array and the readout circuitry, while also supporting multiple samples of information provided by the imaging sensor array.

30 Claims, 11 Drawing Sheets

U.S. PATENT DOCUMENTS

| | | | |
|---|---|---|---|
| 2003/0042400 A1 | 3/2003 | Hynecek | |
| 2003/0216010 A1 | 11/2003 | Atlas | |
| 2003/0223005 A1 | 12/2003 | Atlas | |
| 2005/0001914 A1* | 1/2005 | Kueny | 348/294 |
| 2005/0056771 A1 | 3/2005 | Atlas et al. | |
| 2005/0057672 A1 | 3/2005 | Summa et al. | |
| 2006/0038203 A1 | 2/2006 | Wang et al. | |
| 2006/0267054 A1* | 11/2006 | Martin et al. | 257/291 |

OTHER PUBLICATIONS

Wadsworth et al., "Advances in Scientific-Quality Detectors at JPL: Hybrid Imaging Technology," Further Dev. In Sci. Optical Imag., 2000, Royal Soc. Of Chemistry, pp. 24-30.*

Zheng et al., "Hybrid UV Imager Containing Face-Up AlGaN/GaN Photodiodes," Document NPO-35079, NASA Jet Propulsion Laboratories, Dec. 1, 2005.*

MacDougal et al., "Overview of Rockwell Scientific Imaging Technologies," Scientific Detectors for Astronomy 2005, p. 403-410, 2006.*

Altasens, Inc., "A Progressive 1920×1080 Imaging System-on-Chip for HDTV Cameras", available at http://www.altasens.com/data/wp2.pdf (last visited Feb. 2007).

Altasens, Inc., "Progressive HD CMOS video sensors", AltaSens Technology webpage, available at http://www.altasens.com/technology.html (last visited Feb. 2007).

Atlas, et al., "Hybrid Imaging: a Quantum Leap in Scientific Imaging", Proceedings of the SPIE, 2004, vol. 5167, pp. 121-126.

Atlas, et al., "Sub-electron Readout Noise Focal Plane Arrays for Space Imaging", Proceedings of the SPIE, 2004, vol. 5167, pp. 127-133.

Bogner, P. et al., "A 14b 100MS/s Digitally Self-Calibrated Pipelined ADC in 0.13μm CMOS", IEEE Int'l Solid-State Circuits Conf. (ISSCC) Feb. 2006, pp. 224-225, 650.

Choi, H.-C. et al., "A 15mW 0.2mm2 10b 50MS/s ADC with Wide Input Range", IEEE Int'l Solid State Circuits Conf. (ISSCC), Feb. 2006, San Fran., CA, pp. 226-227.

Clampin, M., "Ultraviolet-optical charge-coupled devices for space instrumentation", Opt.Eng. 41(6), Jun. 2002, Soc. of Photo-Optical Instrumentation Engineers, pp. 1185-1191.

Elkind, S. et al., "Focal plane processor with a digital video output for InSb detectors", Proceedings of SPIE, 2003, vol. 4820, pp. 751-758.

Hodapp, K.-W., et al.,"The Hawaii Infrared Detector Arrays: testing and astron. characterization of prototype and science-grade devices", New Astronomy, 1996, vol. 1, pp. 177-196.

Horowitz, Paul, et al., "The Art of Electronics", 1989, Cambridge University Press, England, pp. 177-179, 222-223.

Janesick, James, "Charge Coupled CMOS and Hybrid Detector Arrays", Keynote Address, Focal Plane Arrays for Space Telescopes, Proc. of SPIE, 2004, vol. 5167, pp. 1-18.

Kaputsa, R. et al., "A 14b 74MS/s CMOS AFE for True High-Definition Camcorders", IEEE Int'l Solid-State Circuits Conf. (ISSCC), Feb. 2006, San Fran., CA, pp. 502-503.

Karasik, B., et al., "Large CMOS Imager Using Hadamard Transform Based Multiplexing, Spaceborne Sensors II", Proc. of SPIE, May 2005, vol. 5798, SPIE, Bellingham, WA, pp. 83-90.

Keast, Craig, L., et al., "A CCD/CMOS-Based Imager with Integrated Focal Plane Signal Processing", IEEE Journal of Solid-State Circuits, Apr. 1993, vol. 28, No. 4, pp. 431-437.

Kim, Ky., et al. "A CMOS Interface IC for CCD Images", proceedings of Int'l Symposium on VLSI Technology, Systems, and Applications, May 1993, Taipei, pp. 277-281.

Kleinfelder, et. al., "Multi-Million Frames/s Sensor Circuits for Pulsed-Source Imaging", Nuclear Science Symposium Conference Record 2003 IEEE, vol. 3, pp. 1504-1508.

Kozlowski, Les, et al., "A Progressive 1920×1080 Imaging System-on-Chip for HDTV Cameras", Session 19, ISSCC 2005, 2005 IEEE Int'l Solid-State Circuits Conf., pp. 358-359.

Krymski, Alexander, et al., "A High-Speed, 240-Frames/s, 4.1 Mpixel CMOS Sensor", IEEE Transactions on Electron Devices, Jan. 2003, vol. 50, No. 1, IEEE, pp. 130-135.

Liu, et al., "CCD/CMOS Hybrid FPA for Low Light Level Imaging", Infrared and Photoelectric Imagers and Detector Devices, Proceedings off SPIE, 2005, vol. 5881, pp. 58810C1-C9.

NASA, "Hybrid Sensors Offer High Performance", Aerospace Technology Innovation, Nov./Dec. 1999, vol. 7, No. 6, NASA Office of Aero-Space Technology, Washington, DC, pp. 9-10.

NASA, "Technical Support Package on Hybrid Imaging Technology", NASA Tech Brief, Sep. 1999, vol. 23, No. 9, JPL, Pasadena, CA, pp. i, 1-3.

Nitta, Y. et al.,"High-Speed Digital Double Sampling with Analog CDS on Column Parallel ADC Architect. for Low-Noise Active Pixel Sensor", IEEE ISSCC Feb. 2006, pp. 500-501.

Otaka, T. et al., "12-Bit Column-Parallel ADC with Accelerated Ramp", 2005 IEEE Workshop on Charged-Coupled Devices & Advanced Image Sensors, Jun. 2005, Session 7, pp. 173-176.

Plassche, R., van de,"Integrated Analog-to-Digital and Digital-to-Analog Converters", Kluwer Academic Publishers, Boston, 1994, pp. 274-280.

Snoeij, M.F. et al., "A Low Power Column-Parallel 12-bit ADC for CMOS Imagers", 2005 IEEE Workshop on Charged Coupled Devices & Advanced Image Sensors, Jun. 2005, pp. 169-172.

Suntharalingam, B.E., et al., "SOI Wafer Selection for CCD/SOI-CMOS Technology", 2000 IEEE International SOI Conference, Oct. 2000, IEEE, pp. 136-137.

Suntharalingam, et al., "Merged CCD/SOI-CMOS Technology", Sensors and Camera Systems for Sci., Indus. and Digital Photo. Apps., Proc. of SPIE, 2000, vol. 3965, pp. 246-253.

Suntharalingam, et al., "Monolithic 3.3V CCD/SOI-CMOS Imager Technology", International Electronics Devices Meeting, 2000, IEEE, pp. 697-700.

Verma, N. et al., "A 25 μW 100kS/s 12b ADC for Wireless Micro-Sensor Applications", IEEE Int'l Solid-State Circuits Conf. (ISSCC), Feb. 2006, San Fran., CA, pp. 222-223, 650.

Wadsworth, et al., "Advances in Scientific-quality Detectors at JPL: Hybrid Imaging Technology", Further Dev. in Sci. Optical Imag., 2000, Royal Soc. of Chemistry, pp. 24-30.

Zhou, Z. et al., "CMOS Active Pixel Sensor with On-chip Successive Approx. Analog-to-digital converter", IEEE Trans. Electron Devices, Oct. 1997, vol. 44, iss.10. pp. 1759-1763.

* cited by examiner

HYBRID IMAGER

CROSS-REFERENCE TO RELATED APPLICATIONS

This application claims the benefit of U.S. Provisional Application No. 60/745,607, filed Apr. 25, 2006, the entire disclosure of which is hereby incorporated herein by reference.

FIELD OF THE INVENTION

The present invention relates to sensing photons. More particularly, the present invention relates to a hybrid imager including a charge coupled device photon detector formed on a first substrate that is interconnected to readout circuitry formed on at least a second substrate.

BACKGROUND

Imaging devices are useful in a large number of applications. Particularly in the field of devices operating in remote locations and/or used in connection with the sending of image data in real time or near real time, focal plane arrays including photon detectors capable of producing an electrical signal in response to sensing photons have been developed. Of the various technologies produced for use with such focal plane arrays, charge coupled devices (CCDs) have proven to provide exceptional optical performance. Therefore, high performance photon detectors often feature a CCD sensor.

Additionally, in the field of aerospace sensors, Time Delayed Integration Charge Coupled Devices (TDI CCDs) are uniquely suited to on orbit observations due to their nearly noiseless charge transfer and summing capability combined with an orbital motion that scans the image across the sensor.

CCDs, however, are characterized by relatively high power consumption. For devices in which high power consumption is a concern, devices formed using other processes, such as Complimentary Metal Oxide Semiconductor (CMOS) devices, are preferable. In particular, the technology required to produce low power consumption, densely packaged processing circuitry using CMOS technology is well developed. However, CMOS photon sensors typically produce a noisier signal than do CCD devices, and generally have less desirable optical performance. In addition, it is more difficult to perform the function of Time Delayed Integration (TDI) in a purely CMOS photon sensor.

Accordingly, it would be desirable to create a photon sensor in which the exceptional optical performance of a CCD photon detector was combined with the low power consumption and dense circuitry packaging available using CMOS processes. Combining the CCD and CMOS processes on a single substrate, however, has proven difficult. Such difficulties arise from fundamental incompatibilities between the two processes, including different processing temperatures and required oxide thicknesses. In addition, devices created on a single substrate using both CCD and CMOS technologies can suffer from poor image quality because of charge transfer inefficiency and high noise due to non-optimized processes.

In order to avoid integrating incompatible fabrication process technologies, devices that utilize a structure formed on a first substrate using a first process (e.g. a CCD photon detector) interconnected to a second substrate using a second process (e.g. a CMOS readout) have been developed. Such systems have typically sensed or read an amount of charge from the detector (first) substrate, and have then amplified the charge on the readout and processing (second) substrate to obtain a signal that can be used to create an image.

Additionally, it should be noted that charge detection generally can be performed only once with respect to a particular collection of charge. Also, providing an un-amplified or un-buffered signal from the CCD can in many cases result in a degraded signal.

SUMMARY

The present invention is directed to solving these and other problems and disadvantages of the prior art.

At least one embodiment of our invention is based in part on the fact that the power dissipation in a CCD can be dramatically reduced by extracting data from the CCD at or near the column (parallel) outputs thus removing the power intensive serial shift registers. Thus the combination of a CCD photon detector with column parallel voltage outputs driving a CMOS readout circuit including digitization and possibly data processing would provide significant advantages over the present state of the art. Our invention accordingly relates to combining separately fabricated CCD photon detectors incorporating voltage outputs with CMOS readout circuits into a single photodetection system. In many cases, this involves mechanically and electrically bonding the detector substrate to the readout circuit substrate using state of the art techniques. Note that in some cases, others may refer to columns as rows and vice versa.

In accordance with embodiments of the present invention, a photon sensor system is provided that includes a charge coupled device (CCD) photon detector on a first semiconductor substrate that is associated with a sense node. The sense node of the first semiconductor substrate is electrically interconnected to a readout circuit on a second semiconductor substrate. In particular, the charge coupled device sense node provides a voltage signal to the readout circuit across the electrical interconnection. The first semiconductor substrate may comprise structures formed in silicon or other semiconductor material, while the second semiconductor substrate may comprise semiconductor structures that are different than the structures of the first semiconductor substrate. In accordance with embodiments of the present invention, the electrical connections may form signal lines and may comprise bump bonds, wires, vias, or traces that may in certain embodiments be formed on a third substrate. In accordance with still further embodiments of the present invention, the first and second semiconductor substrates are mechanically interconnected to one another, either directly or through a third substrate.

The sense node, also known as an output node, on the first semiconductor substrate may be buffered by one or more transistors on the first or photon detector substrate, before a signal is transmitted to the readout circuit on a second semiconductor substrate. As an example, the transistor or transistors may comprise or be part of an amplifier comprising a source follower formed on the CCD (first semiconductor substrate). As a further example, the transistor or transistors may comprise or be part of a voltage mode amplifier formed on the CCD.

In accordance with still other embodiments, a charge to voltage amplifier may be provided on the CCD. In accordance with other embodiments of the present invention, a voltage signal from the sense node is passed to the readout circuit on the second semiconductor substrate, without amplification on the first semiconductor substrate. The readout circuit on the second semiconductor substrate that receives the voltage signal may comprise a voltage amplifier, a voltage comparator, a buffer or an analog to digital converter. Moreover, the voltage of the sense node may be read using various techniques, including the use of correlated double sampling.

In accordance with embodiments of the present invention, methods for sensing light may include creating an electrical charge in response to detecting photons using a CCD fabricated on or comprising a first semiconductor substrate. Moreover, the first semiconductor substrate may comprise a silicon semiconductor. A first collection also known as a first packet of charges including all or some proportion of the electrical charge created in response to detecting photons is collected in a first potential well. A voltage signal is subsequently generated by reading a first voltage associated with the first packet (collection) of charges deposited in the first potential well. The first voltage signal is provided to a first circuit component formed on a second semiconductor substrate, and the first voltage signal is processed using circuitry including the first circuit component on the second semiconductor substrate. In accordance with still other embodiments of the present invention, a second voltage signal is created by reading a second voltage associated with the first packet of charges deposited in the first potential well. That is, a voltage associated with a first packet of charge deposited in a potential well on the first semiconductor substrate can be read multiple times.

Additional features and advantages of embodiments of the present invention will become more readily apparent from the following description, particularly when taken together with the accompanying drawings.

DETAILED DESCRIPTION

Figure 1:
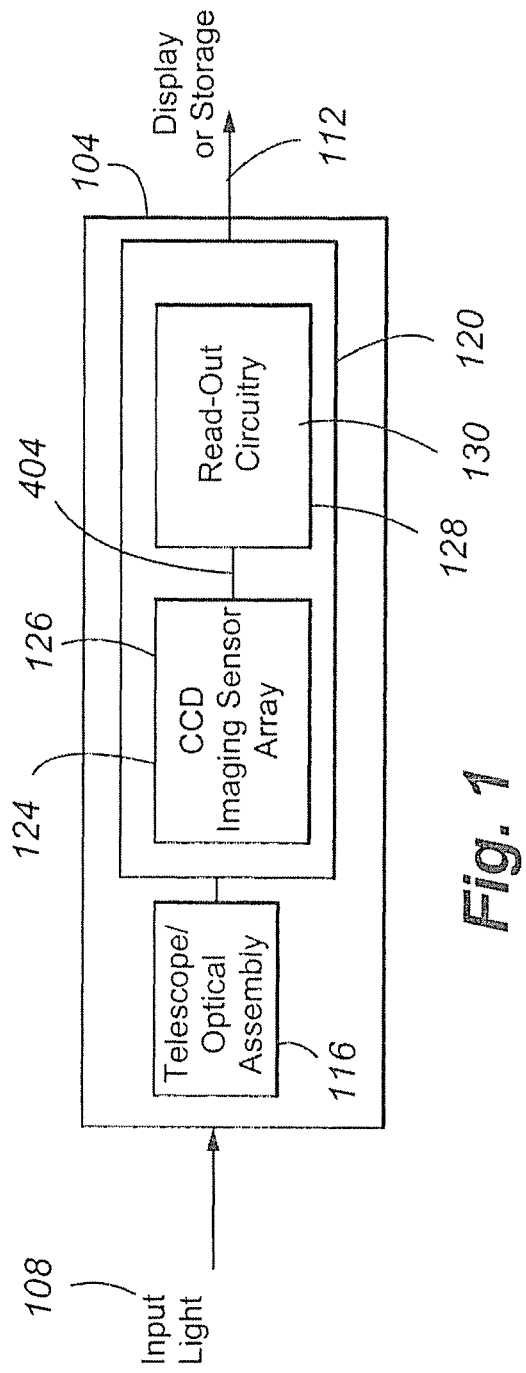
FIG. 1 is a block diagram depicting components of a photon sensor system in accordance with embodiments of the present invention.

FIG. 1 is a schematic depiction of an imaging system 104 in accordance with embodiments of the present invention. The imaging system 104 operates to receive input light 108 and create or derive an image from the input light for display and/or storage 112. In general, the imaging system 104 may include a telescope or other optical assembly 116 that collects and focuses the input light 108. More particularly, the telescope or optical assembly 116 images the collected input light 108 onto a hybrid imager or detector 120. The hybrid imager 120 comprises a charge coupled device (CCD) imaging sensor array or photon detector 124 formed on a first semiconductor substrate 126. The CCD imaging sensor array 124 may comprise a silicon-based CCD that is sensitive to visible wavelengths. Moreover, the CCD imaging sensor array 124 may comprise a focal plane array. The hybrid imager 120 also includes readout circuitry 128 or means for processing a voltage signal. The readout circuitry 128 is generally formed on at least a second semiconductor substrate 130, separate from the first semiconductor substrate on which the CCD imaging sensor array 124 is formed. The readout circuitry 128 may be fabricated with a different process than the imaging sensor array 124. For example but without limitation, the readout circuitry 128 may comprise a Complementary Metal-Oxide Semiconductor (CMOS), Negative-Channel Metal-Oxide Semiconductor (NMOS), or Positive-Channel Metal-Oxide Semiconductor (PMOS) device. In accordance with further embodiments of the present invention, the readout circuitry 128 formed on the second semiconductor substrate 130 may be created using a process that is incompatible with the process used to create the imaging sensor array 124. The CCD imaging sensor array 124 and the readout circuitry 128 semiconductor substrates 126 and 130 may be directly mechanically joined or affixed to one another. For example, the first 126 and second 130 semiconductor substrates may be bump bonded, glued and/or laminated to one another. In addition, various electrical interconnections are completed between the CCD imaging sensor array 124 and the readout circuitry 128.

In accordance with embodiments of the present invention, the first and second semiconductor substrates 126 and 130 either comprise the same material (e.g. silicon), or are matched such that they have similar or substantially the same coefficients of thermal expansion. For example, the first and second semiconductor substrates may have thermal coefficients of expansion within about 5% of one another. As a further example, the first and second semiconductor substrates may have thermal coefficients of expansion within about 1% of one another. By matching substrate 126 and 130 materials so that they have the same or a similar coefficient of thermal expansion, the integrity of the mechanical and electrical connections can be maintained. In addition, such matching allows a proper alignment between the substrates 126 and 130 to be maintained.

In operation, light focused onto the CCD imaging sensor array 124 by the telescope/optical assembly 116 causes electrical charge to be accumulated in photosensitive areas of the CCD imaging sensor array 124 in proportion to the intensity of the illumination falling on the photosensitive areas. A voltage signal from the accumulated charge is then transferred to the readout circuitry 128 on the second semiconductor substrate 130. Transfer of the voltage signal may be by a bump bond, a wire, a via, a trace formed on a third substrate, or any other electrical interconnection 404.

Figure 2:
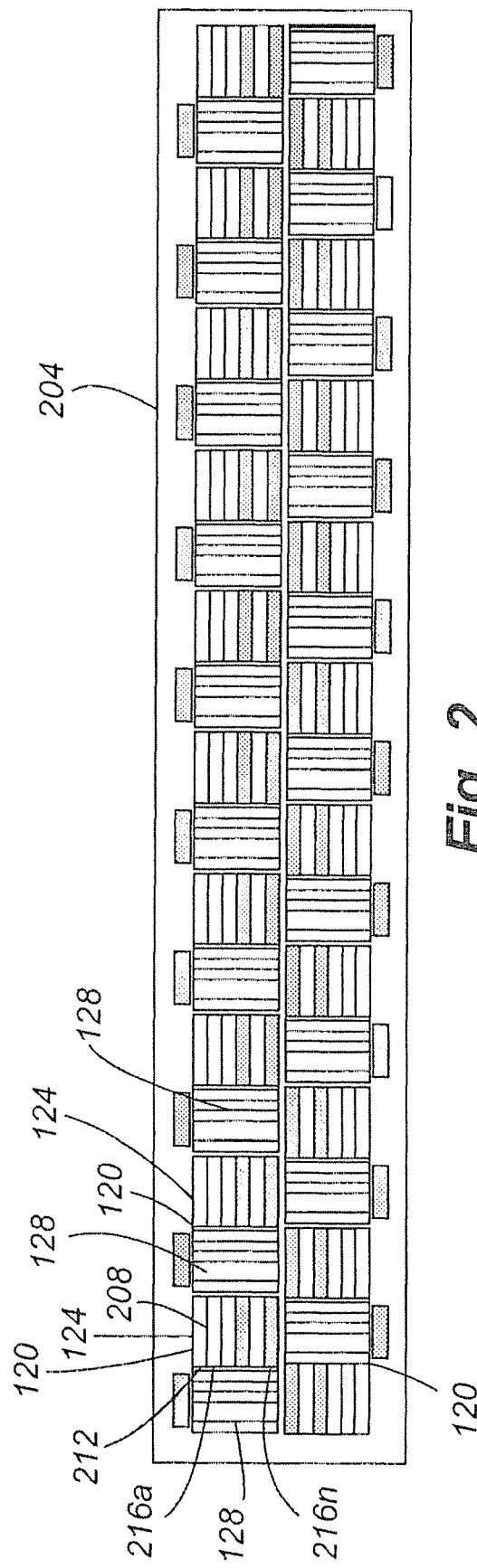
FIG. 2 depicts an arrangement of a focal plane array in accordance with embodiments of the present invention.

An example focal plane assembly 204 formed from a plurality of hybrid imagers 120 each comprising a CCD imaging sensor array 124 and associated readout circuitry 128 is illustrated in FIG. 2. As depicted in the figure, each CCD imaging sensor array 124 may comprise filters 208 to determine the portion of the spectrum to which associated pixels are sensitive. For example, each CCD imaging sensor array 124 may be associated with a panchromatic filter 212, which allows light of wavelengths within all or most of the effective sensitivity range of the underlying pixels to pass to those pixels. In addition, a number of multi-spectral 216 filters may be included for filtering light to other pixels in the CCD imaging sensor array 124. For example, eight different multi-spectral filters 216 may be provided to allow for color discrimination by the imaging sensor 104. Accordingly, as can be appreciated by one of skill in the art, the multi-spectral filters 216a-n may allow light of different portions or sections of the spectrum to pass to underlying pixels of the CCD imaging sensor array 124. Moreover, by providing a plurality of hybrid imagers 120, optical performance, such as resolved area and resolution can be improved.

As can be appreciated by one of skill in the art, each filter 208 may overlay a number of pixels. Moreover, because of the greater amount of energy that is allowed to pass through a panchromatic filter 212 as compared to a multi-spectral filter 216, pixels included in an array overlaid by a panchromatic filter 212 may each have an area that is smaller than pixels within an array overlaid by one of the multi-spectral 216 filters. As an example, and without limitation, an array of pixels overlaid by a panchromatic filter 212 may be fabricated with pixels that are 8 microns square in an array of 4000×128 pixels, while an array of pixels overlaid by a multi-spectral 216 filter may comprise pixels that are 32 microns square in an array of 1000×32 pixels.

The readout circuitry 128 may include various circuits and arrangements for receiving a voltage signal from the CCD imaging sensor array 124. For example, the readout circuitry 128 may include voltage references, timing and control circuitry. As a further example, the readout circuitry 128 may include analog pre-amplifier and readout circuitry, and analog to digital converter circuitry. As another example, the readout circuitry 128 may include processing circuitry running a compression algorithm. A further example of circuitry that may be included as part of the readout circuitry 128 includes interface and driver electronics. As the readout circuitry 128 is located on the second semiconductor substrate 130, such circuitry may be formed using processes that are different than those used to form the CCD imaging sensor array 124 on the first semiconductor substrate 126. For example, the readout circuitry 128 may be fowled using processes having more favorable power consumption and signal processing characteristics.

Figure 3:
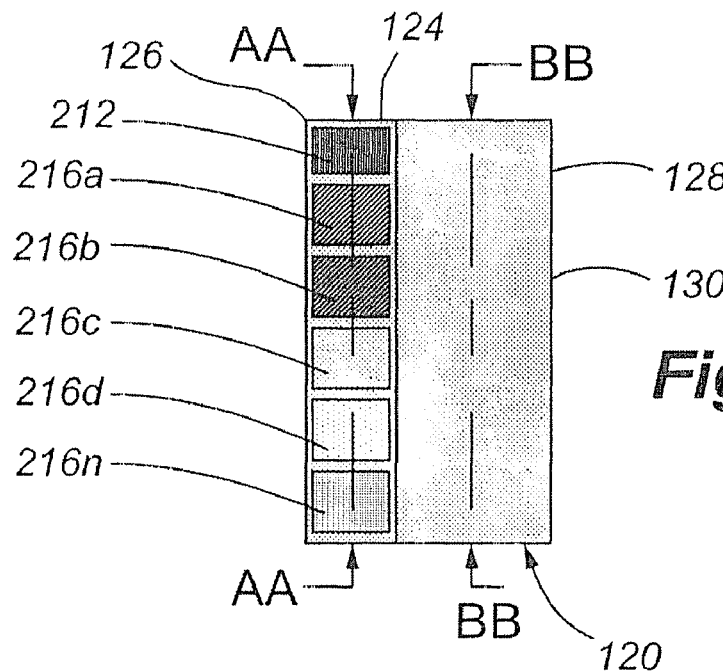
FIG. 3 is a plan view of a hybrid imager or detector in accordance with embodiments of the present invention.

FIG. 3 is a plan view of a hybrid imager 120 in accordance with embodiments of the present invention. As previously noted, the hybrid imager 120 generally includes a CCD imaging sensor array 124 formed on a first semiconductor substrate 126 interconnected to readout circuitry 128 formed on a second semiconductor substrate 130. Moreover, the imaging sensor array 124 may comprise a plurality of pixels, some of which are overlaid by a panchromatic filter 212, to provide high resolution and/or high light gathering capabilities, and groups of pixels overlaid by multi-spectral filters 216a-n, to provide color discrimination. As shown in the example hybrid imager 120 of FIG. 3, the first semiconductor substrate 126 may have an area that is smaller than the area of the second semiconductor substrate 130. Moreover, the first semiconductor substrate 126 may overlay a portion of the second semiconductor substrate 130. Such a configuration may be advantageous, for example where the area required by the readout circuitry 128 supporting the CCD imaging sensor array 124 is greater than the area required by that imaging sensor array 124.

Figure 4:
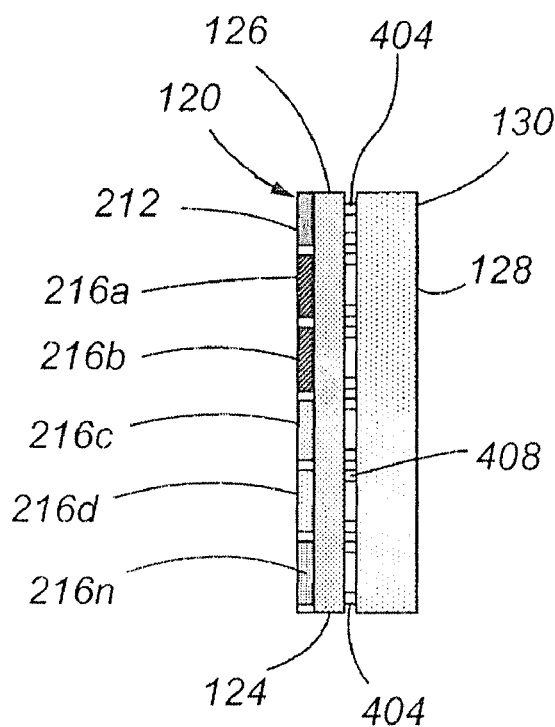
FIG. 4 is a cross-section of the hybrid imager of FIG. 3 taken along line AA-AA.

FIG. 4 is a cross-section of the hybrid imager 120 illustrated in FIG. 3, taken along section line AA-AA. Interconnections 404 between the first 126 and second 130 semiconductor substrates are formed at bonds 408. Such bonds 408 may comprise bump bonds such as indium bonds, and may further comprise a means for passing voltage signals from the first semiconductor substrate 126 to the second semiconductor substrate 130. Moreover, such bonds 408 may perform both a mechanical and an electrical interconnection 404 function. In other embodiments, bonds 408 may comprise vias.

Figure 5:
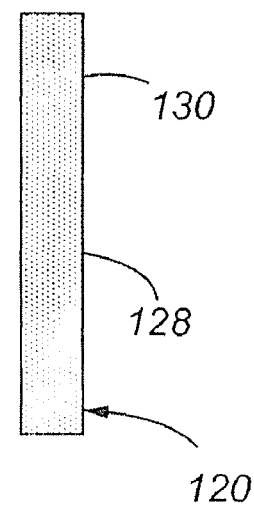
FIG. 5 is a cross-section of the hybrid imager of FIG. 3 taken along line BB-BB.

FIG. 5 is a cross-section of the hybrid imager 120 of FIG. 3 taken along section line BB-BB and looking towards the right in that figure. Comparing the view of the hybrid imager 120 shown in FIG. 5 to the view of the hybrid imager 120 shown in FIG. 4, it is apparent that the area of the imaging sensor array 124 is less than the area of the readout circuitry 128 such that the imaging sensor array 124 extends across only a partial portion of the second semiconductor substrate 130. Accordingly, the portion of the hybrid imager 120 shown in FIG. 5 does not include any part of the imaging sensor array 124.

Figure 6:
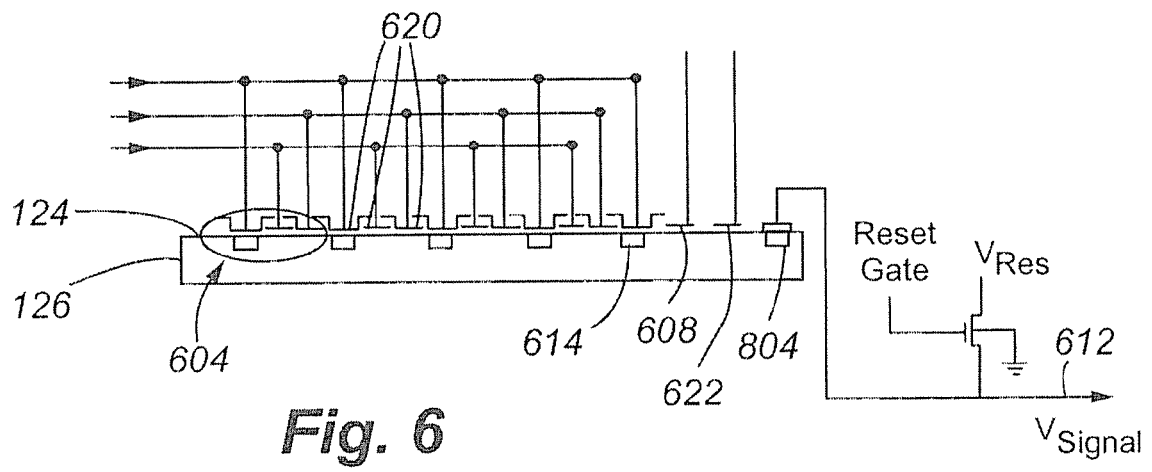
FIG. 6 is a cross-section of a substrate comprising an imaging sensor array in accordance with embodiments of the present invention.

FIG. 6 is a cross-section showing some features of a first semiconductor substrate 126 comprising an imaging sensor array 124 in accordance with the embodiments of the present invention. As shown, the imaging sensor array 124 includes a plurality of pixels or means for detecting light 604 formed in the semiconductor substrate 126. In addition, the imaging sensor array 124 includes a readout or summing well 608 for improved noise performance and a sense node (output node) 804, from which a voltage signal may be provided to readout circuitry 128 (not shown in FIG. 6) formed on a second semiconductor substrate 130. Moreover, the sense node 804 typically comprises a contact to the floating diffusion. Other embodiments may not employ a summing well 608. In general, and as can be appreciated by one of skill in the art, each pixel 604 comprises a photo sensitive area. More particularly, in response to photons incident on a pixel 604, a charge is accumulated. Moreover, within the effective sensitivity range of a pixel 604, the amount of accumulated charge depends on the number of photons received at the pixel 604 during an integration period. As can also be appreciated by one of skill in the art, the pixels 604 illustrated in FIG. 6 may comprise a linear array or one column (or row) within an area array or sub-array included in an imaging sensor array 124 in accordance with embodiments of the present invention. Accordingly, after an integration period, collected charge may be transferred from one pixel 604 to the next in series and finally, for embodiments in which a summing well is not employed to the last well 614. In other embodiments, charge may be accumulated in successive pixels 604 during successive integration periods. Substantially all of this accumulated charge is then transferred into the last well 614. This process is also known to those skilled in the art as Time Delayed Integration (TDI). Again, a summing well 608 may be used just before the sense node 804 for improved noise performance. Although FIG. 6 shows 3-phase clocking, other embodiments may utilize 4-phase or another number of phase clocking. More particularly, once each collection of charge is deposited in the last well 614, the charge is moved from the last well 614 to the sense node 804 to read out a voltage signal 612 which is transmitted to readout circuitry 128 (not shown in FIG. 6). Alternatively, in embodiments in which an amplifier (e.g. a buffer or a CTIA (Capacitance Transimpedance Amplifier)) is provided on the first semiconductor substrate 126, either a voltage or a charge signal may be read from the sense node 804, and a voltage signal 612 may then be provided by the output of the amplifier. In general, movement of charge between pixels is accomplished using transfer gates 620. The last gate (output gate) 622 functions to isolate the sense node from the last well or in cases in which it exists, the last gate 622 functions to isolate the sense node from the summing well. Although the sense node 804 is depicted adjacent to the voltage signal 612, it can be appreciated that intermediate circuitry may be provided in accordance with embodiments of the present invention. As can be appreciated by one of skill in the art, intermediate circuitry may be interposed between the sense node 804 and the output voltage signal 612, forming a part of the output. In addition, multiple sense nodes 804 may be associated with a column (row) of pixels 604. In one embodiment, sense nodes 804 may be present at both ends of a column (row) of CCDs and used for forward or reverse operation of the CCD.

Figure 7:
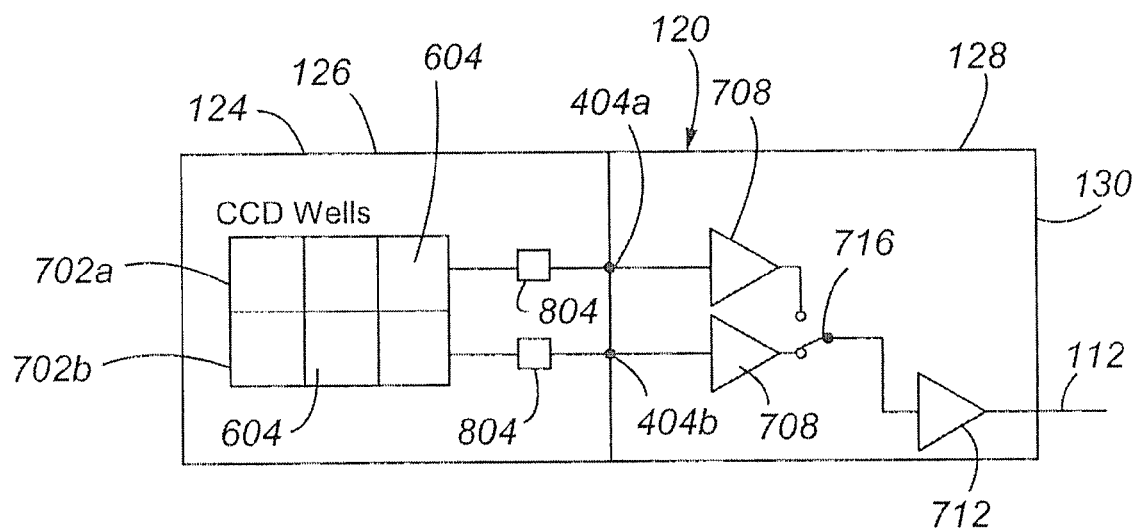
FIG. 7 is a schematic depiction of components of a hybrid imager in accordance with embodiments of the present invention.

FIG. 7 is a schematic depiction of components of a hybrid imager 120 in accordance with embodiments of the present invention. Two columns (rows) 702a-b of pixels 604 comprising the photo-sensitive area of the imaging sensor array 124 are depicted, with each column (row) 702 interconnected to a sense node 804. First and second interconnections 404a-b provide voltage signals from the first and second sense nodes 804 to the inputs of pre-amplifiers 708 formed on the second semiconductor substrate 130, and comprising part of the readout circuitry 128. As illustrated, each sense node 804 may be associated with a single pre-amplifier 708, although other arrangements are possible. Moreover, because the pre-amplifiers 708 comprise voltage mode amplifiers and are provided with a voltage signal from the sense nodes 804 by the interconnections 404a-b, the voltage of the sense nodes 804 can be read multiple times to provide multiple measurements of a single collection of charge. Accordingly, multiple samples (measurements) can be taken of the charge in or associated with a sense node 804 in order to improve the signal to noise ratio. One or more additional amplifiers 712 may also be provided as part of the readout circuitry 128. As illustrated in FIG. 7, the input to such additional amplifiers 712 may comprise the output from one or more of the pre-amplifiers 708. A switch 716 may be provided so that amplifier 712 may selectively receive its input from either of the amplifiers 708. Because this additional amplifier 712 receives input from at least one other amplifier 708 included in the readout circuitry 128, the additional amplifier 712 may not necessarily be a voltage mode amplifier. The output from the additional amplifier 712 may then be provided to additional circuitry associated with another substrate or device for processing (including for example correlated double sampling (CDS) and analog to digital conversion), display or storage. Alternatively, such additional circuitry may be provided as part of the readout circuitry 128. For example, memory may be provided for temporary or long-term storage of image data collected by pixels 604 on the imaging sensor array 124.

Figure 8:
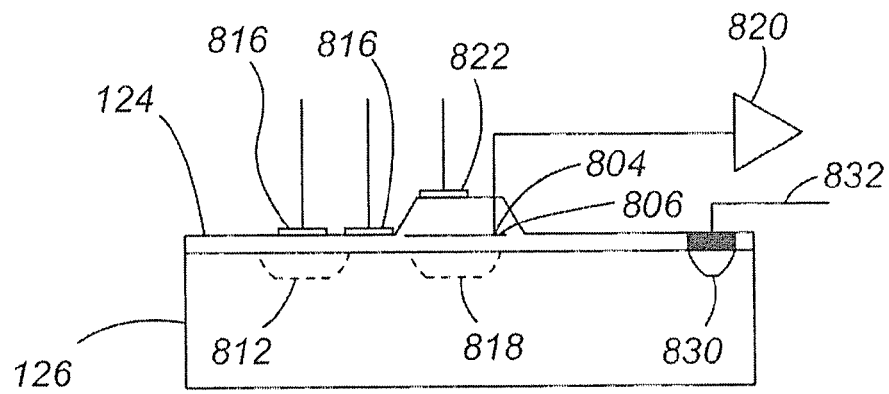
FIG. 8 is a schematic depiction of portions of a hybrid imager including a voltage sense node in accordance with embodiments of the present invention.

FIG. 8 is a schematic depiction of portions of a hybrid imager 124 including a sense node 804 that provides a voltage signal in accordance with the embodiments of the present invention. In particular, in the illustrated embodiment, the sense node 804 comprises a floating gate 806 overlaying a potential well 818. The transfer of charge to the potential well 818 from an adjacent potential well 812 may be controlled using control gates 816 sometimes also known as transfer or CCD gates. In particular, the potential well 818 can be set into depletion using bias gate 822. As charge associated with an image signal from one of the pixels 604 is transferred into the potential well 818, voltage changes on the gate 806 are introduced that can be sensed. For example, a voltage signal from the floating gate 806 may be provided to an amplifier or pre-amplifier 820 formed on the first semiconductor substrate 126 or on the second semiconductor substrate 130. After being sensed, the signal charge packets can be transferred out of the potential well 818 and removed through a diode 830 and a diode drain 832 or they can remain beneath the floating gate 806 to allow multiple samples for noise reduction. After the desired number of samples is obtained, the charge can then be removed through the diode drain 832.

In order to sense the changes in voltage due to signal charge, a number of methods may be used. For example, the floating gate 806 can be allowed to float while the charge is introduced and the voltage change can be sensed. Alternatively, the floating gate 806 associated with the potential well 818 can be clamped to a selected voltage as the charge is introduced and then released so that a signal may be detected from the change in voltage after the clamp is released. Other techniques known in the art may also be used to sense the voltage associated with a collection of charge.

Figure 9:
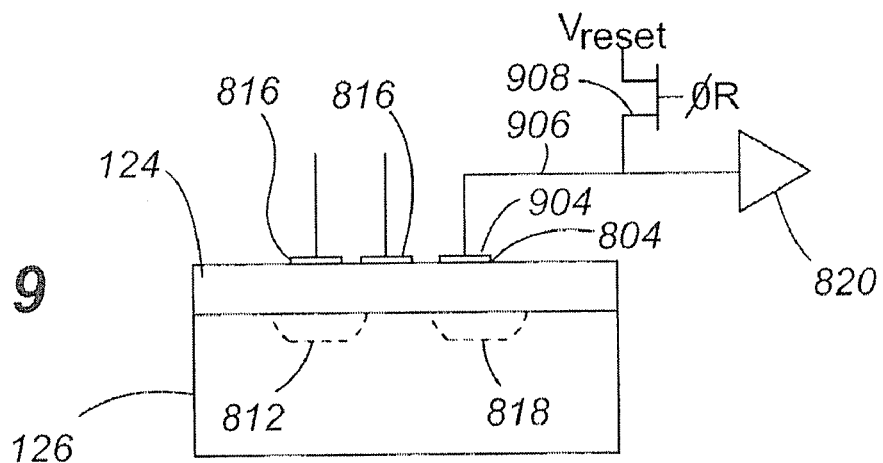
FIG. 9 is a schematic depiction of portions of a hybrid imager including a voltage sense node in accordance with other embodiments of the present invention.

Portions of a hybrid imager 124 in accordance with other embodiments of the present invention are illustrated in FIG. 9. In particular, FIG. 9 differs from the hybrid imager 124 depicted in FIG. 8 in that the voltage signal from the sense node 804 is provided using an electrode 904 that also functions as a floating gate. The voltage on electrode (gate) 904 is determined by the reset transistor 908. In addition, the signal line 906 for carrying the voltage signal from the sense node 804 to the voltage mode amplifier 820 is associated with a reset switch or transistor 908. The reset switch 908 and/or the voltage mode amplifier 820 may be formed on either the first semiconductor substrate 126 or the second semiconductor substrate 130. After being sensed (possibly multiple times), the signal charge packets can be removed through a diode drain (not shown in FIG. 9).

Figure 10:
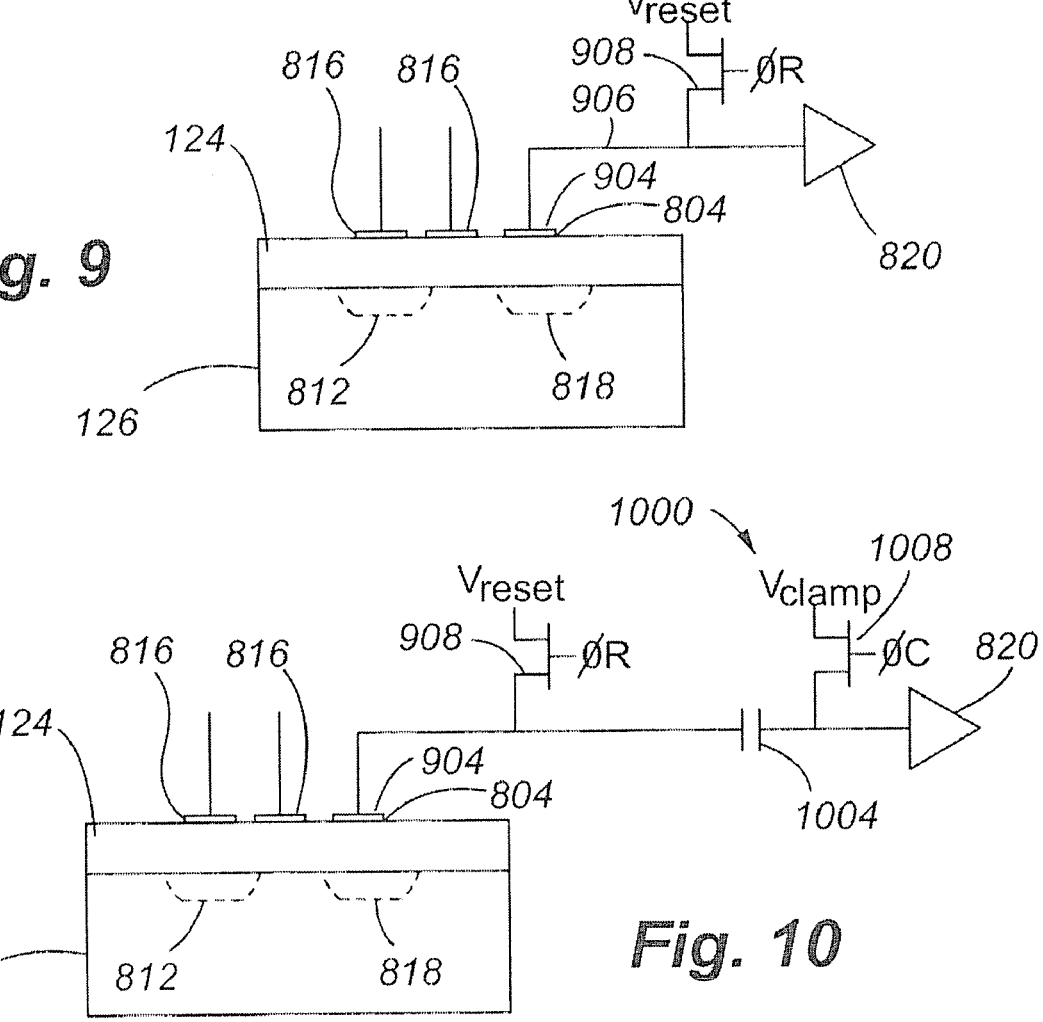
FIG. 10 is a schematic depiction of portions of a hybrid imager incorporating correlated double sampling in accordance with embodiments of the present invention.

FIG. 10 is a schematic depiction of portions of a hybrid imager 120 incorporating means for correlated double sampling or a correlated double sampler (CDS) circuit 1000 in accordance with embodiments of the present invention. A capacitor 1004 is provided for receiving a signal from the sense node 804 after the sense node 804 has been reset through operation of a reset switch or transistor 908. A clamp switch or transistor 1008 is provided along the portion of the signal line providing a voltage signal from the capacitor 1004 to the voltage mode amplifier 820. As can be appreciated by one of skill in the art, this arrangement allows the ambiguity in the voltage on the sense node 804 to be substantially reduced. This noise reduction occurs following a reset operation after which collected charge comprising image information has been transferred from the associated potential well 812 to the sense node 804. After being sensed (possibly multiple times), the signal charge packets can be removed through a diode drain (not shown in FIG. 10).

Figure 11:
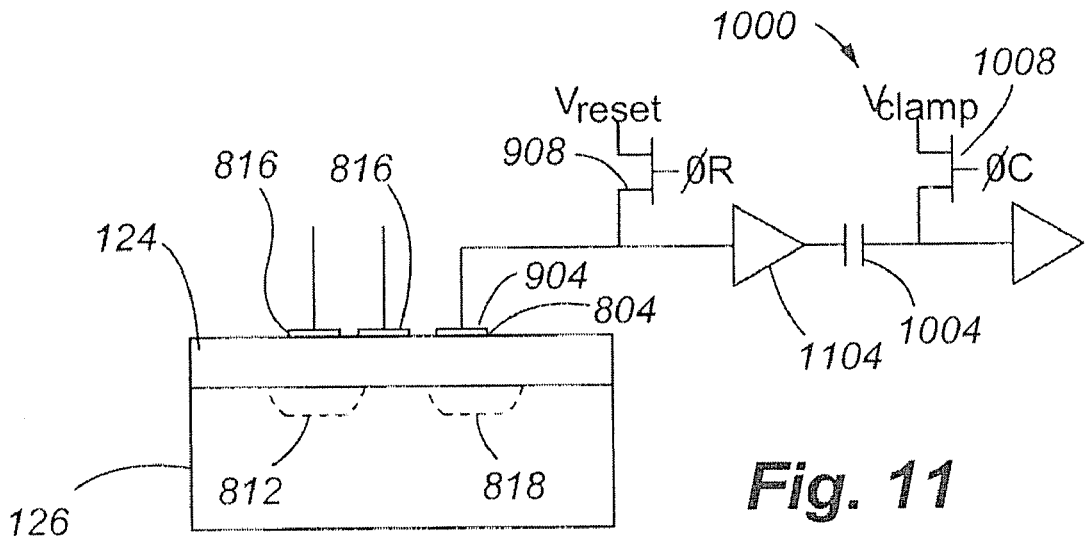
FIG. 11 is a schematic depiction of portions of a hybrid imager incorporating correlated double sampling in accordance with other embodiments of the present invention.

Another arrangement for providing a CDS circuit 1000 in accordance with the embodiments of the present invention is illustrated in FIG. 11. In this arrangement, a preamplifier 1104 is provided between the capacitor 1004 and the sense node 804. As can be appreciated by one of skill in the art, such an arrangement can be advantageous where the capacitance of the capacitor 1004 and/or associated signal lines is large. After being sensed (possibly multiple times), the signal charge packets can be removed through a diode drain (not shown in FIG. 11).

Figure 12:
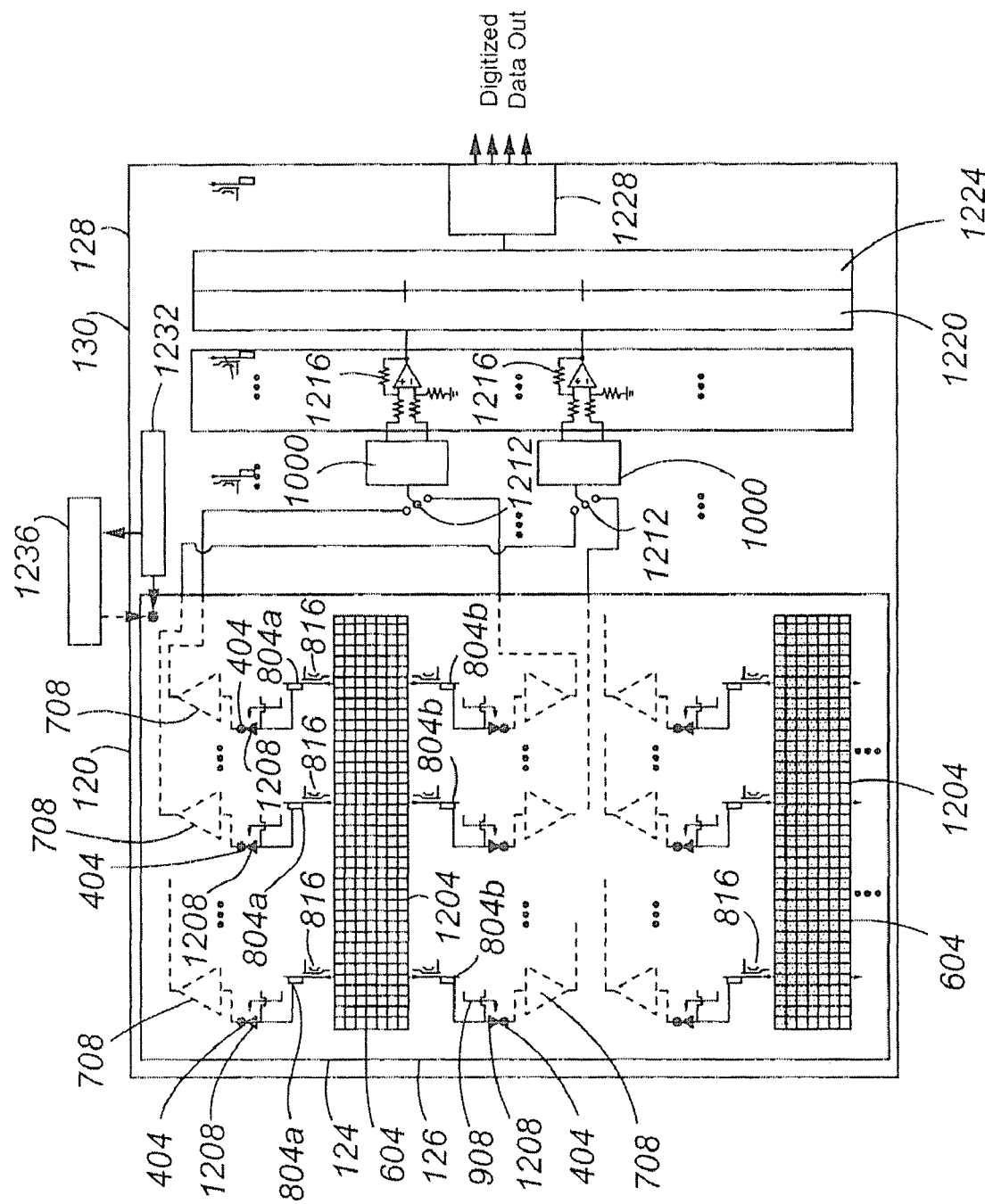
FIG. 12 is a schematic depiction of portions of a hybrid imager including details of components in accordance with embodiments of the present invention.

FIG. 12 is a schematic depiction of portions of a hybrid imager 120 in accordance with embodiments of the present invention. The CCD imaging sensor array 124 includes a plurality of pixels 604 grouped in a plurality of sub-arrays 1204. Each column (row) of pixels 604 may be associated with a sense node 804a. In addition, a second sense node 804b at an end of each column (row) of pixels 604 opposite the end at which the first sense node 804a is located may be provided to support bi-directional output from the sub-arrays 1204. As illustrated, an amplifier 1208, formed on the first semiconductor substrate 126, may be associated with each sense node 804. For purposes of clarity of illustration, not every column (row) of pixels is shown with associated sense node 804 or amplifiers 1208, or other components subsequently described in connection with the figure. As can be appreciated by one of skill in the art, the amplifier 1208 need not provide an output voltage that is different than or amplified as compared to the voltage sensed from the sense node 804. Accordingly, the amplifier 1208 may comprise a source follower or other buffer to provide a voltage buffered output. In accordance with other embodiments of the present invention, the amplifier 1208 may read a charge signal from the associated sense node 804, and provide a voltage signal at the output of the amplifier. Accordingly, a charge to voltage conversion may be performed on the first semiconductor substrate 126 comprising the CCD imaging sensor array 124. Alternatively, the amplifier 1208 on the first semiconductor substrate 126 comprising the CCD imaging sensor may be omitted, in which case the voltage signal is read from each sense node 804 directly.

The voltage signal from the sense node 804, whether it is read from the un-amplified collection of charge in the sense node 804 or is read from the output of an amplifier 1208 on the first semiconductor substrate 126, is provided to readout circuitry 128 formed on the second semiconductor substrate 130 by an interconnection 404. For example, the voltage signal from a pixel 604 of the CCD imaging sensor array 124 on the first semiconductor substrate 126 is communicated to the input of a voltage-mode amplifier or pre-amplifier 708 comprising at least a portion of the readout circuitry 128 formed on the second semiconductor substrate 130. The amplifiers 708 are shown in FIG. 12 using dotted lines because in the illustrated example they are located on a portion of the second semiconductor substrate 130 that underlies the first semiconductor substrate 126 in that figure. As can be appreciated by one of skill in the art, a voltage-mode amplifier is characterized by a high or an essentially infinite input impedance. As a result, the voltage of the sense node 804, as communicated to the input of the amplifier 708 by the interconnection 404, can be sampled or read multiple times. This is in contrast to a charge mode amplifier, which if connected to a sense node 804 directly would deplete the charge collected in the sense node 804, and therefore could be read from the sense node 804 only once. As can also be appreciated by one of skill in the art, the amplifier 708 need not provide an output voltage that is different than or amplified as compared to the input voltage. For example, the amplifier 708 may comprise a source follower or other buffer.

As illustrated in FIG. 12, the first semiconductor substrate 126 may include a number of means for forming potential barriers, or control gates 816. As can be appreciated by one of skill in the art, control gates 816 may be provided for moving collected charge from a pixel 604 or sequentially from a column (row) of pixels 604 to a sense node 804. Also, reset switches 908 can be formed on the first semiconductor substrate 126 for resetting associated sense nodes 804.

The readout circuitry 128 formed on the second semiconductor substrate 130, as previously noted, may include an amplifier or preamplifier 708. Alternatively or in addition, the readout circuitry 128 may include a CDS circuit 1000 to reduce low frequency noise components, including 1/f noise. If bi-directional output is provided, the sense node 804 from which a voltage signal for a pixel 604 or pixels 604 included in a column (row) of pixels is obtained may be selected using a switch 1212 formed on the second semiconductor substrate 130. Additional amplification may be provided by column (row) amplifiers 1216. These amplifiers 1216 may comprise differential or single-ended amplifiers. In accordance with embodiments of the present invention, the signal from a pixel or the integrated signal from many pixels in a TDI arrangement is then processed by an analog to digital converter (ADC) 1220. As examples, an ADC may comprise a ramp ADC or a pipeline ADC. After data is digitized by an ADC, it can be digitally processed by a serializer 1224, also formed on the second semiconductor substrate 130. The output from the serializer can then be passed from the second semiconductor substrate 130 to other circuitry, for example for storage or display. Transfer of the digital data may be by a digital data link 1228. For example, the digital data link 1228 may comprise a low voltage differential signaling (LVDS) link. Clock generation may be provided by clock generation circuitry 1232 provided as part of the readout circuitry 128 on the second semiconductor substrate 130. In accordance with embodiments of the present invention, external circuitry 1236, or circuitry not formed on either the first 126 or second 130 semiconductor substrates, may be used to couple the clocking signals into the CCD sensing array 124 at the correct voltages. In other embodiments, the external circuitry 1236 may also be formed on the second semiconductor substrate 130. Although a number of circuits have been described as being formed on or as part of the second semiconductor substrate 130, some or all of these circuits may be omitted or formed on other substrates.

Figure 13:
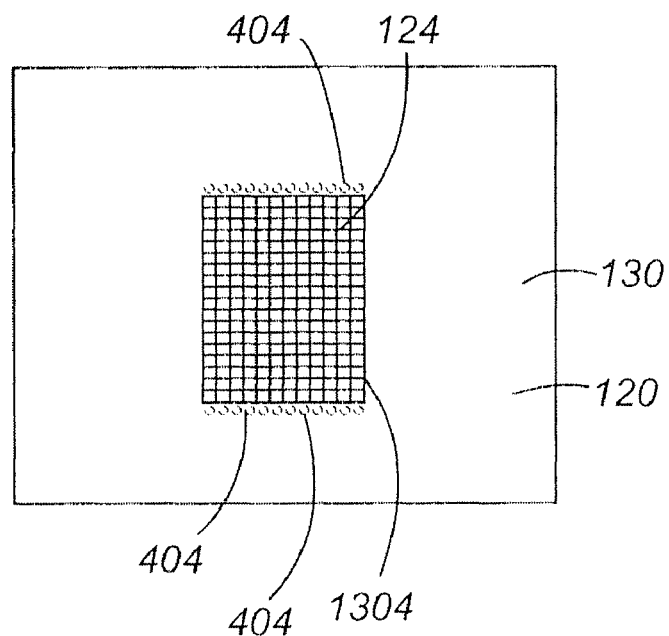
FIG. 13 illustrates in plan view a configuration of a hybrid imager in accordance with embodiments of the present invention.
Figure 14:
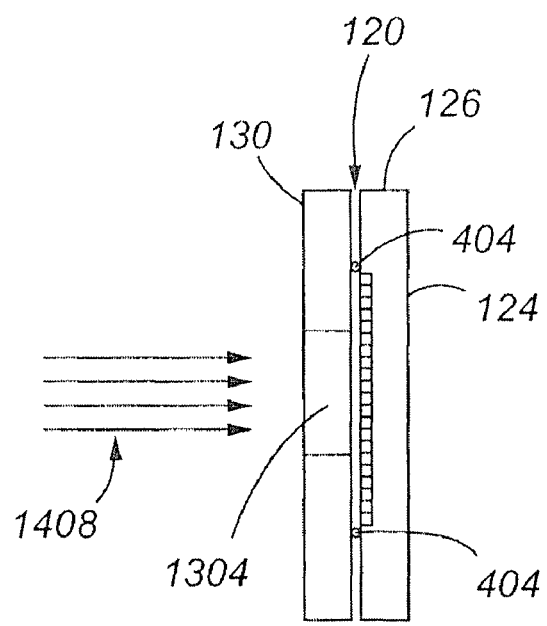
FIG. 14 illustrates the hybrid imager configuration of FIG. 13 in cross-section.

FIG. 13 illustrates in plan view a configuration of a hybrid imager 120 in accordance with embodiments of the present invention, while FIG. 14 illustrates the hybrid imager 120 of FIG. 13 in cross-section. In this configuration, a window or hole 1304 is formed within the periphery of the second semiconductor substrate 130 to allow incident photons 1408 to pass to the photo sensitive area of the imaging sensor array 124 formed on the first semiconductor substrate 126. In accordance with such embodiments, the imaging sensor array 124 may comprise a front side illuminated CCD. Interconnections 404, such an indium bumps, couple the voltage signal from the voltage sense nodes 804 of the imaging sensor array 124 to the input voltage amplifiers on the second semiconductor substrate 130. In other embodiments, voltage amplifiers on the first semiconductor substrate 126 may be interposed between the sense nodes 804 and the amplifiers on the second semiconductor substrate 130.

Figure 15:
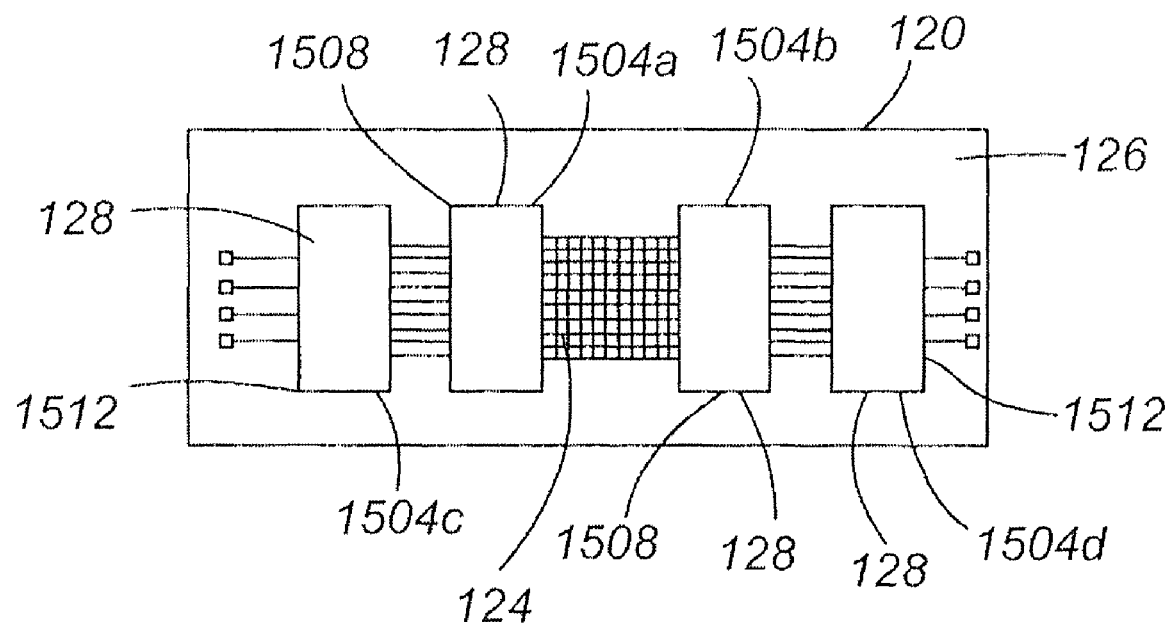
FIG. 15 illustrates in plan view a configuration of a hybrid imager in accordance with other embodiments of the present invention.
Figure 16:
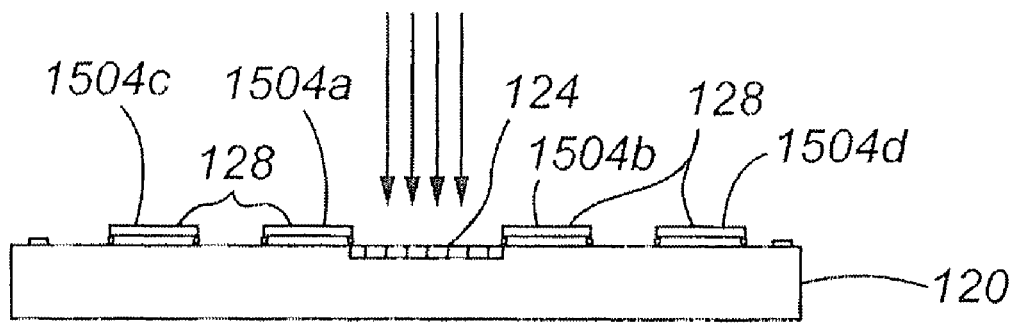
FIG. 16 illustrates the hybrid imager configuration of FIG. 15 in cross-section.

FIGS. 15 and 16 illustrate another configuration of a hybrid imager 120 in accordance with embodiments of the present invention in plan view and in side view, respectively. In this configuration, a relatively large first semiconductor substrate 126 comprising the CCD sensing array 124 is interconnected to a plurality of secondary semiconductor substrates 1504, shown as second 1504a, third 1504b, fourth 1504c and fifth 1504d semiconductor substrates, on which the readout circuitry 128 is formed. More particularly, the second 1504a and third 1504b semiconductor substrates may comprise high voltage readout circuitry 1508, while the fourth 1504c and fifth 1504d semiconductor substrates may comprise low voltage readout circuitry 1512. In accordance with embodiments of the present invention, the high voltage readout circuitry 1508 may comprise amplification and voltage shifting circuitry. The high voltage circuitry 1508 may be formed, for example, using a CMOS process that is suited for relatively high voltage applications (e.g. about −10 to about +5 Volts). The low voltage readout circuitry 1512 may comprise analog to digital conversion and data processing circuitry. The low voltage readout circuitry 1512 may be formed using, for example, a CMOS process that is suited for relatively low voltage applications (e.g. from about 1.8 to about 3.3 Volts), though these voltages are expected to move lower as the state of the art in CMOS technologies advances.

Figure 17:
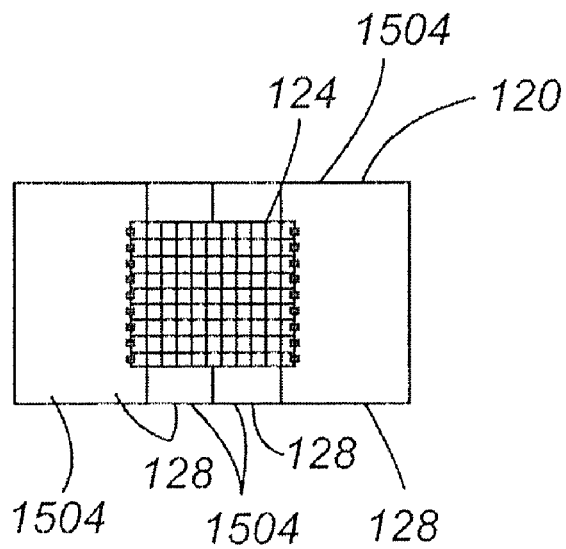
FIG. 17 illustrates in plan view a configuration of a hybrid imager in accordance with other embodiments of the present invention.
Figure 18:
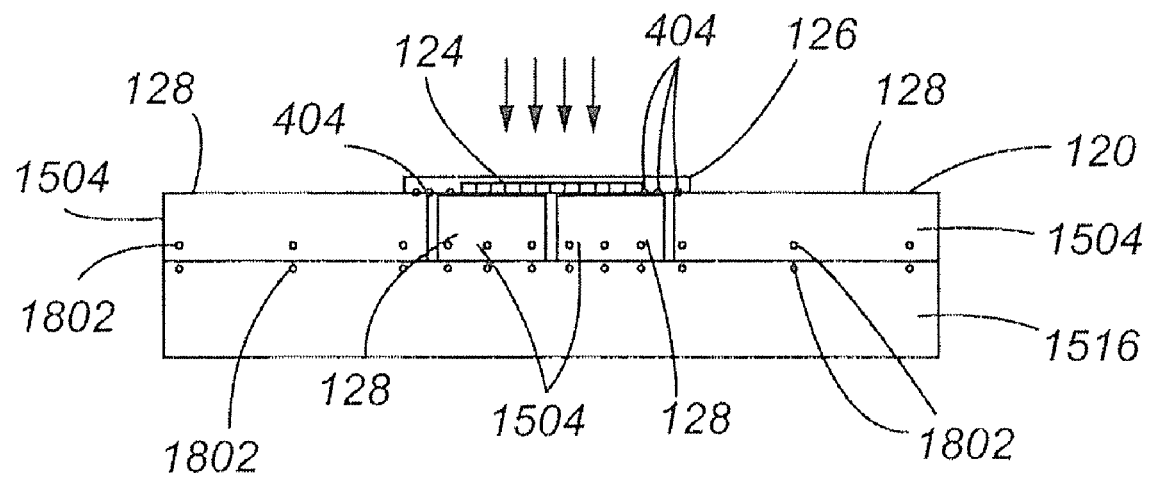
FIG. 18 illustrates the hybrid imager configuration of FIG. 17 in cross-section.

A configuration of a hybrid imager 120 in accordance with embodiments of the present invention that incorporates a support substrate 1516 is illustrated in FIGS. 17 and 18. The support substrate generally comprises a substrate 1516 formed from a material having a coefficient of thermal expansion that is within about 5% of the coefficients of thermal expansion of the first and second semiconductor substrates 126 and 130. In addition, the support substrate 1516 may comprise a semiconductor substrate and may also be composed of the same material as either of semiconductor substrates 126 or 130. As an example, if anodic bonding is used to bond a glass support substrate to a silicon semiconductor substrate, one may chose for example a HOYA SD-2 glass substrate which has a CTE that very closely matches that of silicon over the anodic bonding temperature range. Other support substrate materials well matched for silicon anodic bonding include Corning 7740 and 7070 wafer glass. This close tracking of the Coefficients of Thermal Expansion (CTEs) is illustrated in the manufacturer's data sheets for these products and shows that CTE differences of less than about 5% are acceptable in bonding. Common fiberglass printed circuit board materials, for example G10 or FR4 have CTEs of about 9 to 12 E-6/degrees Celsius at room temperature (depending on the axis). Printed circuit board material would not be a good support substrate for a silicon semiconductor substrate as silicon has a CTE of about 2.6E-6/degrees Celsius at room temperature and the CTE differences are several hundred percent. Accordingly, the support substrate 1516 is distinguishable from common fiberglass circuit boards or other materials that generally cannot be directly interconnected to a semiconductor substrate and maintain connection and alignment integrity within a wide range of operating temperatures (e.g. within a range of at least 60 degrees Celsius). In this example, the imaging sensor array 124 comprises a backside illuminated thinned CCD that is interconnected to readout circuitry 128 distributed on a number of semiconductor substrates 1504 by interconnects 404. In addition, the imaging sensor array 124 is interconnected to each of the number of semiconductor substrates 1504 carrying readout circuitry 128 through such interconnections 404. In this example, the first substrate 126 is interconnected to the support substrate 1516 through the substrates 1504 on which the readout circuitry 128 is formed. Alignment may be achieved using alignment fiducials 1802.

Figure 19:
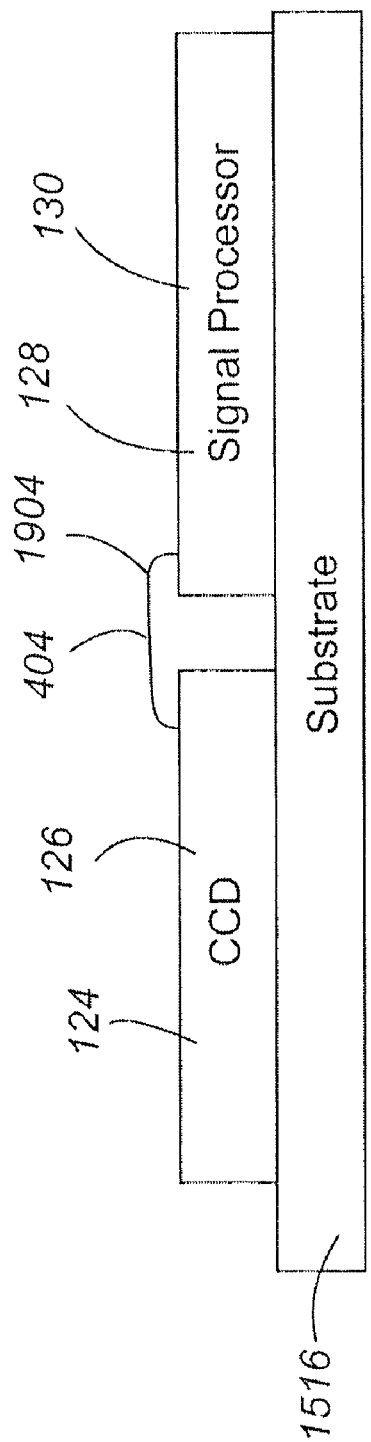
FIG. 19 illustrates a configuration for interconnecting substrates included in a hybrid imager in accordance with embodiments of the present invention.
Figure 20:
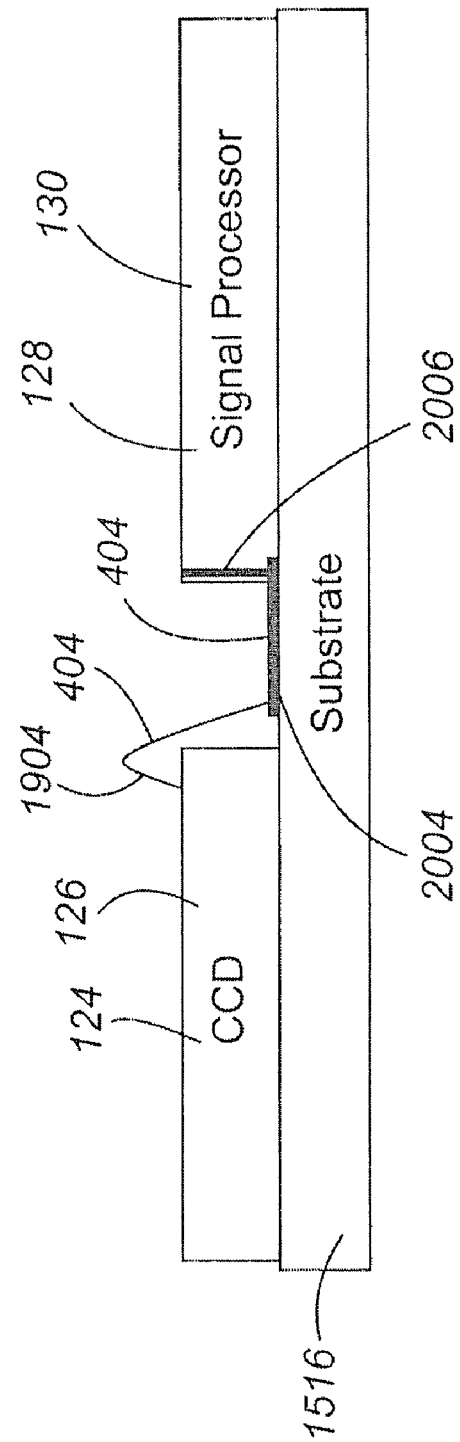
FIG. 20 illustrates another configuration for interconnecting substrates included in a hybrid imager in accordance with embodiments of the present invention.

Another configuration of an imaging sensor array 124 in accordance with embodiments of the present invention having a first semiconductor substrate 126 on which the imaging sensor array 124 is formed, and a second semiconductor substrate 130 on which readout circuitry 128 is formed, are fixed or mechanically interconnected to a support substrate 1516, is illustrated in FIG. 19. Interconnections 404 between the first 126 and second semiconductor substrates 130 in such an arrangement comprise electrical interconnections only. Accordingly, such interconnections 404 may be in the form of wires 1904. Alternatively or in addition, as illustrated in FIG. 20, electrical interconnections 404 can comprise traces or other conductors 2004 formed on or as part of the support substrate 1516. Moreover, such conductors 2004 may be interconnected to circuitry on the first and second semiconductor substrates by wires 1904 or vias 2006.

Figure 21:
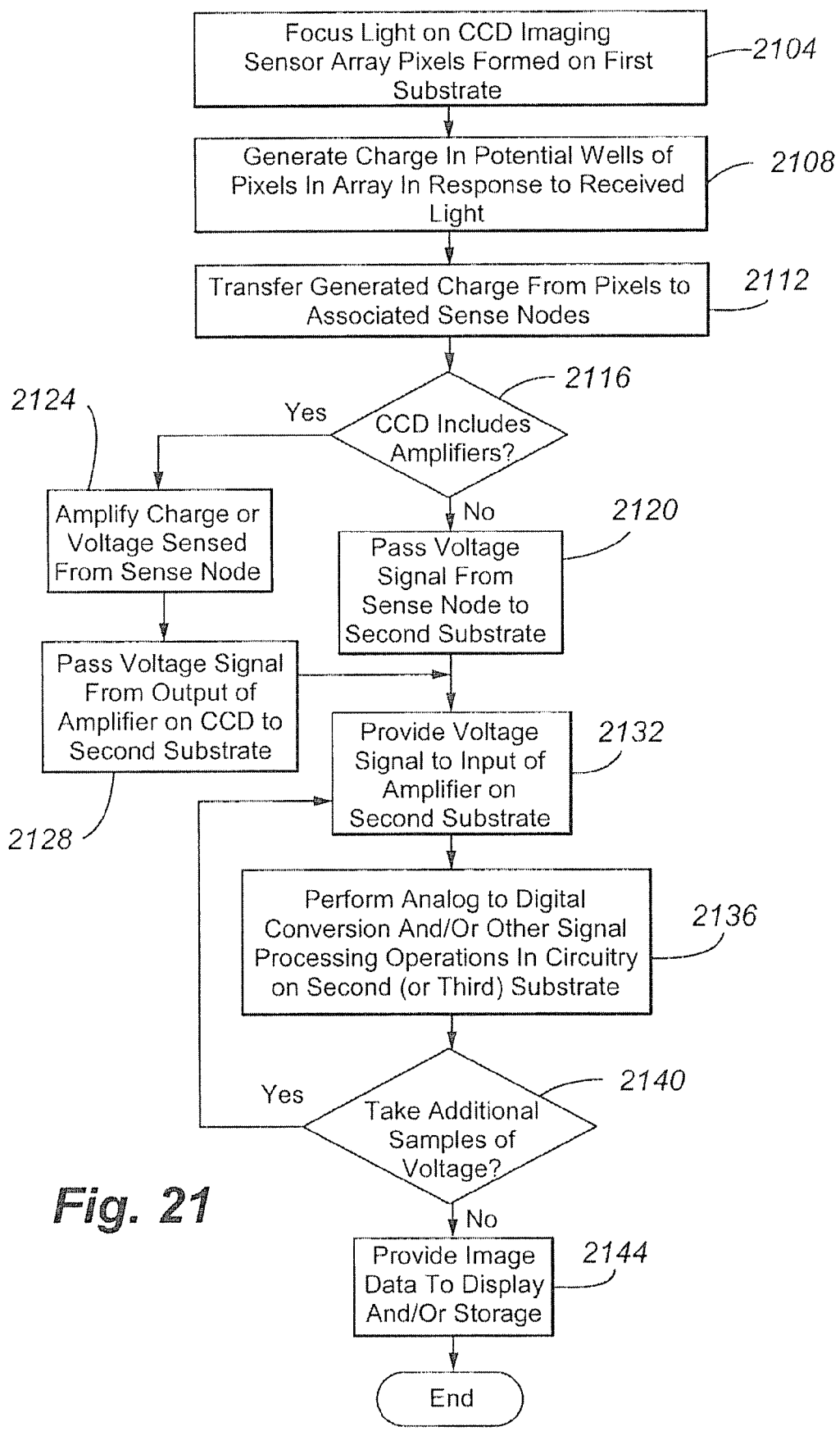
FIG. 21 is a flow chart illustrating aspects of a method for obtaining image information in accordance with embodiments of the present invention.

FIG. 21 illustrates aspects of the operation of a hybrid imaging system 104 in accordance with embodiments of the present invention. Initially, at Step 2104, light 108 is input to the telescope/optical assembly 116 of the imaging system 104, and focused onto a focal plane array 204 comprising a plurality of imaging sensor arrays 124. As can be appreciated by one of skill in the art, each imaging sensor array 124 includes a plurality of pixels 604, which generate a charge in response to the receipt of incident photons. Moreover, the charges produced by incident photons are collected within a potential well associated with the pixel 604 over a period of time or integration period (Step 2108). The generated charge is then transferred from potential wells associated with the pixels 604 to a sense node 804 (Step 2112). In a typical arrangement, one sense node 804 is associated with a column (row) comprising a plurality of pixels 604. However, this arrangement is not required. Where a plurality of pixels 604 are associated with a single sense node 804, the charge collected by the individual pixels 604 are passed down the column (row) and read out in sequence. In a TDI configuration, additional charges may be added as generated by additional photons as the charges are passed down the column (row) and read out. As can also be appreciated by one of skill in the art, the transfer of collections of charge between pixels and/or potential wells is typically accomplished by sequentially raising and dropping potential barriers created using control gates 816.

At Step 2116, the process may branch depending on whether amplifiers are provided on the first semiconductor substrate 126 for buffering and/or amplifying a signal from the sense nodes 804. If the imaging sensor array does not include amplifiers for receiving a signal from the sense nodes 804, the voltage signal read is passed directly from each of the sense nodes 804 to associated amplifiers provided as part of readout circuitry 128 formed on a second semiconductor substrate 130 (Step 2120). Alternatively, if amplifiers are formed on the imaging sensor array 124, a charge or a voltage signal sensed from the sense nodes 804 may each be amplified (Step 2124). A voltage signal is then passed from the output of the amplifiers on the first semiconductor substrate to readout circuitry 128 formed on a second semiconductor substrate 130 (Step 2128). After a voltage signal has been passed to readout circuitry 128 on the second semiconductor substrate 130 at either Step 2120 or Step 2128, the received voltage is provided to the input of an amplifier 708 on the second semiconductor substrate 130 (Step 2132). Analog to digital conversion and/or other signal processing operations may then be performed in readout circuitry 128 formed on the second semiconductor substrate 130 (or on a third or other substrate) (Step 2136). A determination may then be made as to whether additional samples of the voltage signal obtained from the sense nodes 804 or the output of the amplifiers on the first semiconductor substrate are to be taken (Step 2140). In particular, because a voltage signal is provided across the interconnection 404 between the first 126 and second 130 semiconductor substrates, the voltage signals are continuously available (at least until the sense nodes 804 are reset), and multiple samples of the voltage can be taken by the readout circuitry 128 without substantially degrading or altering the signal. If additional samples are to be taken, the process returns to step 2132. Otherwise, the collected image data is then provided to a display and/or to memory or other data storage (Step 2144).

As can be appreciated by one of skill in the art, the described process is generally performed for each active column (row) of pixels 604 included in an imaging sensor array 124. Moreover, the operations for each active column (row) of pixels 604 may be performed in parallel.

In accordance with still other embodiments of the present invention, the hybrid imager 120 comprises an imaging sensor array 124 sourced from a first vendor or manufacturer and readout circuitry 128 sourced from a second vendor or manufacturer. This arrangement allows the different expertise and experience of different vendors to be capitalized upon. In particular, each of the components of the hybrid imager 120 formed on the different semiconductor substrates 126, 130 can be acquired from the vendor with the highest level of expertise and experience for the different functionality of the different components, and/or the different processes used to form the components. Moreover, where multiple secondary semiconductor substrates 1504 are included in the hybrid imager, some or all of the different secondary semiconductor substrates 1504 can be obtained from different vendors or sources. By sourcing components formed on different semiconductor substrates, such as the imaging array 124 and/or one or more readout circuits 128, from different vendors, the functionality and/or cost of obtaining those components can be more optimized than if the various components were all sourced from a common vendor that was not particularly adept at designing and/or manufacturing one or more of those components.

Figure 22:
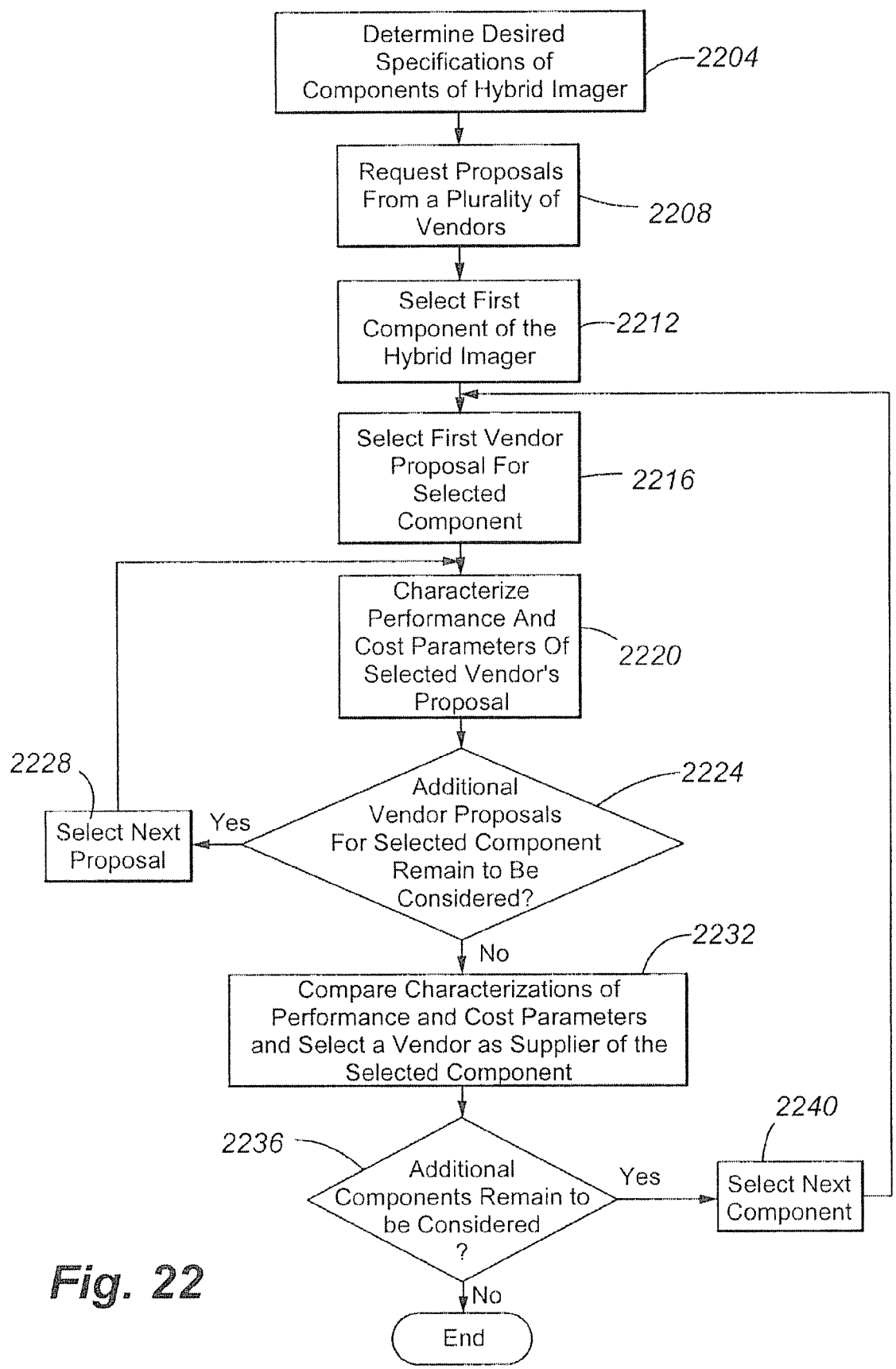
FIG. 22 is a flow chart illustrating aspects of a method for sourcing components of an imaging system in accordance with embodiments of the present invention.

In FIG. 22, aspects of a method for creating a hybrid imager 120 in accordance with embodiments of the present invention are illustrated. Initially, the desired specifications of components, such as the imaging sensor array 124 and the readout circuitry 128, are determined (Step 2204). This initial determination can include determining the number of secondary semiconductor substrates 1504 over which the readout circuitry 128 is to be distributed, if more than a single second semiconductor substrate 130 is to be used. Proposals for supplying the components may then be requested from vendors (Step 2208).

At step 2212, a first component of the hybrid imager is selected for consideration. A first vendor proposal for the first component may then be selected (Step 2216). The performance and cost parameters of the selected proposal can then be characterized (Step 2220). A determination is then made as to whether additional vendor proposals for the selected component remain to be considered (Step 2224). If additional proposals remain to be considered, a next proposal is selected (Step 2228) and the process returns to Step 2220. After it is determined that all of the vendor proposals for the selected component have been considered, the characterizations of performance and cost parameters for the selected component are compared, and a vendor is selected as the supplier for that component (Step 2232).

At Step 2236, a determination may be made as to whether additional components of the hybrid imager 120 for which proposals were requested remain to be considered. If additional components remain to be considered, a next component is selected (Step 2240), and the process may return to Step 2216. If no components remain to be considered, the process may end.

Although embodiments of the described imaging system 104 have used as examples imaging sensor arrays 124 comprising groups of pixels associated with panchromatic and multi-spectral filters 208, it should be appreciated that other configurations are possible. For example, an imaging sensor array 124 in accordance with embodiments of the present invention may comprise a two-dimensional array of pixels that are each associated with a microfilter for wavelength or color discrimination. Accordingly, embodiments of the present invention are not limited to any particular arrangement of pixels. In addition, an imaging system 104 in accordance with embodiments of the present invention can be used in connection with any type of imaging device, including digital still and video cameras deployed as part of remotely controlled vehicles, in fixed locations, in orbit above planets or moons, in the vicinity of comets or asteroids, in hand portable devices or in other applications.

The foregoing discussion of the invention has been presented for purposes of illustration and description. Further, the description is not intended to limit the invention to the form disclosed herein. Consequently, variations and modifications commensurate with the above teachings, within the skill and knowledge of the relevant art, are within the scope of the present invention. The embodiments described hereinabove are further intended to explain the best mode presently known of practicing the invention and to enable others skilled in the art to utilize the invention in such or in other embodiments and with various modifications required by their particular application or use of the invention. It is intended that the appended claims be construed to include the alternative embodiments to the extent permitted by the prior art.

What is claimed is:

1. A photon sensor system, comprising:
   a first charge coupled device photon detector on a first semiconductor substrate, wherein the first charge coupled device photon detector is at least sensitive to light having a wavelength within a visible range of wavelengths;
   a first sense node on the first semiconductor substrate, wherein the first photon detector is interconnected to the first sense node, and wherein no amplifier is included on the first semiconductor substrate that is interconnected to the first photon detector;
   a first readout circuit on a second semiconductor substrate;
   a first signal line, wherein the first readout circuit on the second semiconductor substrate is electrically interconnected to the first sense node on the first semiconductor substrate by a first connection including the first signal line, wherein the first sense node on the first semiconductor substrate provides a voltage signal to the first readout circuit on the second semiconductor substrate, wherein the first and second semiconductor substrates are directly mechanically interconnected to one another.

2. The sensor system of claim 1 wherein the first semiconductor substrate comprises a silicon semiconductor.

3. The system of claim 1, further comprising:
a first array of charge coupled device photon detectors, wherein the first charge coupled device photon detector is included in the first array of charge coupled device photon detectors.

4. The system of claim 3, wherein a plurality of charge coupled device photon detectors are interconnected to the first sense node.

5. The system of claim 1, wherein the first sense node comprises a floating diffusion.

6. The system of claim 1, wherein a summing well is interposed between the first charge coupled device photon detector and the sense node.

7. The system of claim 1, wherein the first read out circuit on the second semiconductor substrate comprises at least one of an amplifier, a voltage comparator, a buffer, and an analog to digital converter.

8. The sensor system of claim 1, wherein the first charge coupled device and the first sense node on the first semiconductor substrate comprise an imaging array that is sourced from a first vendor, and wherein the first readout circuit on the second semiconductor substrate comprises readout circuitry that is sourced from a second vendor.

9. The system of claim 1, wherein the sense node is a column or row parallel sense node.

10. The system of claim 1, wherein a first input stage of the first readout circuit on the second semiconductor substrate comprises a voltage amplifier.

11. The system of claim 1, wherein a plurality of charge coupled device photon detectors are interconnected to the first sense node and form part of a Time Delayed Integration Charge Coupled Device photon detector system.

12. The system of claim 1, wherein the mechanical interconnect and the first signal line include bump bonds.

13. The system of claim 1, wherein the first signal line includes a via.

14. The system of claim 1 wherein an outer perimeter of the second semiconductor substrate is larger than an outer perimeter of the first semiconductor substrate.

15. The system of claim 1, wherein the photon detector on the first semiconductor substrate is illuminated through an aperture in the second semiconductor substrate.

16. The system of claim 1, further comprising:
a second photon detector on the first semiconductor substrate;
a second sense node on the first semiconductor substrate;
a second readout circuit on the second semiconductor substrate;
a second signal line, wherein the second readout circuit on the second semiconductor substrate is electrically interconnected to the second sense node on the first semiconductor substrate by a second connection including the second signal line, and wherein the second sense node provides a voltage signal to the second readout circuit.

17. The system of claim 16, wherein the first photon detector is included in a first column comprising a first plurality of photon detectors, and wherein the second photon detector is included in a second column comprising a second plurality of photon detectors.

18. A method of sensing light, comprising:
creating electrical charge in response to detecting photons using a silicon semiconductor charge coupled device formed on a first semiconductor substrate and having a plurality of pixels;
depositing a first packet of charge including all or some proportion of the electrical charge created in response to detecting photons at a first pixel in a first potential well, wherein the amount of charge comprising the first packet of charge deposited in the first potential well depends on a number of photons detected;
creating a first voltage signal by reading a first voltage associated with the first packet of charge deposited in the first potential well, wherein the first voltage signal is created by the first packet of charge;
providing the first voltage signal to a first circuit component formed on a second semiconductor substrate using at least a first electrical conductor, wherein the first packet of charge and the first voltage signal are not amplified or buffered by circuitry included as part of the first semiconductor substrate, wherein the first semiconductor substrate is either:
1) directly mechanically interconnected to the second semiconductor substrate, or
2) electrically and mechanically coupled to the second semiconductor substrate by a third substrate, and wherein the third substrate has a coefficient of thermal expansion within 5% of the coefficient of thermal expansion of the first semiconductor substrate and within 5% of the coefficient of thermal expansion of the second semiconductor substrate;
processing the first voltage signal using circuitry including the first circuit component on the second semiconductor substrate.

19. The method of claim 18, further comprising:
creating a second voltage signal by reading a second voltage associated with the first packet of charge deposited in the first potential well;
providing the second voltage signal from the first substrate to the first circuit component formed on the second semiconductor substrate, wherein the second voltage signal is provided to the first circuit component after the first voltage signal is provided to the first circuit component; and
processing the second voltage signal using circuitry including the first circuit component on the second semiconductor substrate.

20. The method of claim 19, wherein the first and second voltage signals are essentially identical to one another.

21. The method of claim 18, wherein said first voltage signal is created using a first sense electrode that is located on the first semiconductor substrate and proximate to the first potential well, and wherein providing the first voltage signal to a first circuit component includes electrically interconnecting the first sense electrode to the first circuit component using an electrical conductor.

22. The method of claim 18, wherein the first circuit component includes a voltage sense amplifier.

23. The method of claim 18, further comprising:
selecting a first vendor as a supplier of the silicon semiconductor device;
selecting a second vendor as a supplier of the first circuit component;
electrically interconnecting the silicon semiconductor device and the first circuit component.

24. A photon sensor system, comprising:
a first semiconductor substrate;
a plurality of means for detecting visible light formed on the first substrate;
a second semiconductor substrate, wherein the first and second semiconductor substrates are one of directly mechanically interconnected to one another and interconnected to one another by a third semiconductor substrate;
first means for passing a first voltage signal from a first means for detecting visible light included in the plurality of means for detecting visible light formed on the first substrate to the second semiconductor substrate, wherein the voltage signal value is dependent on an amount of visible light detected by the means for detecting visible light and wherein the voltage signal value is not amplified by circuitry on the first semiconductor substrate means;
means for processing on the second substrate the first voltage signal formed on the first substrate.

25. The system of claim 24, wherein the first semiconductor substrate does not include any charge amplification device.

26. The system of claim 24, further comprising second means for passing a second voltage signal from a second means for detecting visible light included in the plurality of means for detecting visible light formed on the first substrate to the second semiconductor substrate, wherein the voltage signal value is dependent on an amount of visible light detected by the means for detecting visible light.

27. A photon sensor system, comprising:
a first charge coupled device photon detector on a first semiconductor substrate, wherein the first charge coupled device photon detector is at least sensitive to light having a wavelength within a visible range of wavelengths;
a first sense node on the first semiconductor substrate, wherein the first photon detector is interconnected to the first sense node, and wherein no amplifier on the first semiconductor substrate is associated with the first photon detector;
a first readout circuit on a second semiconductor substrate;
a first signal line, wherein the first readout circuit on the second semiconductor substrate is electrically interconnected to the first sense node on the first semiconductor substrate by a first connection including the first signal line, and wherein the first sense node provides a voltage signal to the first readout circuit;
a third substrate, wherein the first and second semiconductor substrates are mechanically interconnected to one another by the third substrate, and wherein the third substrate has a coefficient of thermal expansion within 5% of the coefficients of thermal expansion of the first and second semiconductor substrates.

28. The sensor system of claim 27 wherein the first semiconductor substrate comprises a silicon semiconductor.

29. The sensor system of claim 27 wherein the first, second, and third semiconductor substrates comprise substantially the same material.

30. The sensor system of claim 27, wherein at least a portion of the first signal line is formed on the third substrate, and wherein the third substrate is used to electrically interconnect the first and second semiconductor substrates to one another.

\* \* \* \* \*